(12) United States Patent
Hartman et al.

(10) Patent No.: US 10,842,046 B2
(45) Date of Patent: Nov. 17, 2020

(54) DENSIFIED FOAM FOR THERMAL INSULATION IN ELECTRONIC DEVICES

(71) Applicant: Boyd Corporation, Pleasanton, CA (US)

(72) Inventors: Richard M. Hartman, Dallas, TX (US); Paul J. Macioce, Milwaukee, WI (US); Robert W. Tait, Plano, TX (US); George H. Ransford, Magnolia, AR (US)

(73) Assignee: Boyd Corporation, Modesto, CA (US)

( * ) Notice: Subject to any disclaimer, the term of this patent is extended or adjusted under 35 U.S.C. 154(b) by 0 days.

(21) Appl. No.: 16/578,554

(22) Filed: Sep. 23, 2019

(65) Prior Publication Data

US 2020/0022285 A1  Jan. 16, 2020

Related U.S. Application Data

(63) Continuation of application No. 15/357,800, filed on Nov. 21, 2016, now Pat. No. 10,448,541.

(Continued)

(51) Int. Cl.
*F28F 13/00* (2006.01)
*H05K 7/20* (2006.01)
(Continued)

(52) U.S. Cl.
CPC ........... *H05K 7/20509* (2013.01); *B32B 5/02* (2013.01); *B32B 5/18* (2013.01); *B32B 5/245* (2013.01); *B32B 7/12* (2013.01); *B32B 7/14* (2013.01); *B32B 9/007* (2013.01); *B32B 9/041* (2013.01); *B32B 9/045* (2013.01); *B32B 9/046* (2013.01); *B32B 9/047* (2013.01); *B32B 15/043* (2013.01); *B32B 15/046* (2013.01); *B32B 15/08* (2013.01); *B32B 15/085* (2013.01); *B32B 15/09* (2013.01); *B32B 15/095* (2013.01); *B32B 15/14* (2013.01);
(Continued)

(58) Field of Classification Search
CPC ...... H05K 7/20509; B32B 15/09; B32B 7/36; B32B 7/32; B32B 27/065; F28F 21/02; F28F 2275/025
USPC ........................................................ 165/135
See application file for complete search history.

(56) References Cited

U.S. PATENT DOCUMENTS 5,303,042 A * 4/1994 Lewis ..................... G09B 5/14
348/14.01
9,070,680 B2 * 6/2015 Kim ..................... H01L 23/4985
(Continued)

*Primary Examiner* — Claire E Rojohn, III
(74) *Attorney, Agent, or Firm* — Botkin & Hall, LLP

(57) ABSTRACT

A heat spreading and insulating material using densified foam is provided that has a heat spreading layer that is adhered to an insulating layer. The material is designed to be used with mobile devices that generate heat adjacent to heat sensitive components. The insulating layer is formed from a compressed layer of polyimide foam to increase its density. The polyimide foam retains a significant amount of insulating properties through the densification process. In some embodiments, an EMI shielding layer is added to improve electrical properties of the device. The heat spreading layer may be a graphite material with heat conducting properties that preferentially conduct heat in-plane but can also be metal foil or other isotropic heat conducting material. The material may also include pressure sensitive layers to permanently apply the material to the mobile device.

11 Claims, 11 Drawing Sheets

Related U.S. Application Data

(60) Provisional application No. 62/257,307, filed on Nov. 19, 2015.

(51) Int. Cl.

| | | |
|---|---|---|
| *B32B 15/20* | (2006.01) | |
| *B32B 27/28* | (2006.01) | |
| *B32B 27/06* | (2006.01) | |
| *B32B 15/04* | (2006.01) | |
| *B32B 15/08* | (2006.01) | |
| *B32B 15/09* | (2006.01) | |
| *B32B 27/36* | (2006.01) | |
| *B32B 9/04* | (2006.01) | |
| *B32B 27/32* | (2006.01) | |
| *B32B 15/085* | (2006.01) | |
| *B32B 15/095* | (2006.01) | |
| *B32B 5/02* | (2006.01) | |
| *B32B 5/24* | (2006.01) | |
| *B32B 15/14* | (2006.01) | |
| *B32B 7/14* | (2006.01) | |
| *B32B 27/40* | (2006.01) | |
| *B32B 5/18* | (2006.01) | |
| *B32B 7/12* | (2006.01) | |
| *B32B 9/00* | (2006.01) | |
| *B32B 27/34* | (2006.01) | |
| *F28F 21/02* | (2006.01) | |
| *F28F 21/06* | (2006.01) | |

(52) U.S. Cl.
CPC ............... *B32B 15/20* (2013.01); *B32B 27/06* (2013.01); *B32B 27/065* (2013.01); *B32B 27/281* (2013.01); *B32B 27/32* (2013.01); *B32B 27/34* (2013.01); *B32B 27/36* (2013.01); *B32B 27/40* (2013.01); *F28F 13/003* (2013.01); *F28F 21/02* (2013.01); *F28F 21/067* (2013.01); *B32B 2250/03* (2013.01); *B32B 2255/10* (2013.01); *B32B 2266/0214* (2013.01); *B32B 2266/06* (2013.01); *B32B 2266/08* (2013.01); *B32B 2307/204* (2013.01); *B32B 2307/206* (2013.01); *B32B 2307/302* (2013.01); *B32B 2307/304* (2013.01); *B32B 2307/306* (2013.01); *B32B 2307/308* (2013.01); *B32B 2307/58* (2013.01); *B32B 2307/5825* (2013.01); *B32B 2307/706* (2013.01); *B32B 2307/708* (2013.01); *B32B 2307/72* (2013.01); *B32B 2307/722* (2013.01); *B32B 2307/732* (2013.01); *B32B 2457/10* (2013.01); *B32B 2457/20* (2013.01); *F28F 2270/00* (2013.01); *F28F 2275/025* (2013.01)

(56) References Cited

U.S. PATENT DOCUMENTS

| | | | | |
|---|---|---|---|---|
| 2002/0051338 A1* | 5/2002 | Jiang | ...................... | G11B 33/14 361/679.36 |
| 2006/0127760 A1* | 6/2006 | Hatta | ...................... | B32B 15/08 429/185 |
| 2013/0022811 A1* | 1/2013 | Ahn | ........................ | B82Y 30/00 428/336 |
| 2014/0376191 A1* | 12/2014 | Hwang | ................... | F28F 13/18 361/720 |
| 2015/0372263 A1* | 12/2015 | Douke | .................... | B32B 15/08 429/176 |
| 2016/0039188 A1* | 2/2016 | Namikawa | .............. | B32B 27/32 156/249 |
| 2016/0049622 A1* | 2/2016 | Hashimoto | ......... | H01M 2/0292 429/176 |
| 2016/0049625 A1* | 2/2016 | Minamitani | ...... | H01M 10/0585 429/185 |
| 2016/0121576 A1* | 5/2016 | Sasaki | ....................... | B32B 7/12 442/370 |
| 2016/0167340 A1* | 6/2016 | Nakamura | .............. | B32B 5/142 361/679.54 |
| 2016/0172638 A1* | 6/2016 | Amano | ............... | H01M 2/0277 429/185 |
| 2016/0204395 A1* | 7/2016 | Oono | ................... | H01M 2/0277 429/176 |
| 2016/0211490 A1* | 7/2016 | Hashimoto | ............. | B32B 37/24 |
| 2016/0249453 A1* | 8/2016 | Tatami | ................. | H05K 3/4611 |
| 2016/0279900 A1* | 9/2016 | Fujiwara | ................ | H01L 23/373 |
| 2016/0279902 A1* | 9/2016 | Yasuda | ................... | B32B 27/06 |
| 2016/0301040 A1* | 10/2016 | Takahagi | ............. | H01M 2/026 |
| 2017/0150651 A1* | 5/2017 | Hartman | ................... | B32B 5/18 |
| 2017/0164757 A1* | 6/2017 | Thomas | ................... | A47C 7/74 |
| 2017/0368795 A1* | 12/2017 | Kutsumizu | ............. | C01B 32/20 |
| 2018/0023904 A1* | 1/2018 | Kato | ....................... | B32B 27/36 165/80.2 |

* cited by examiner

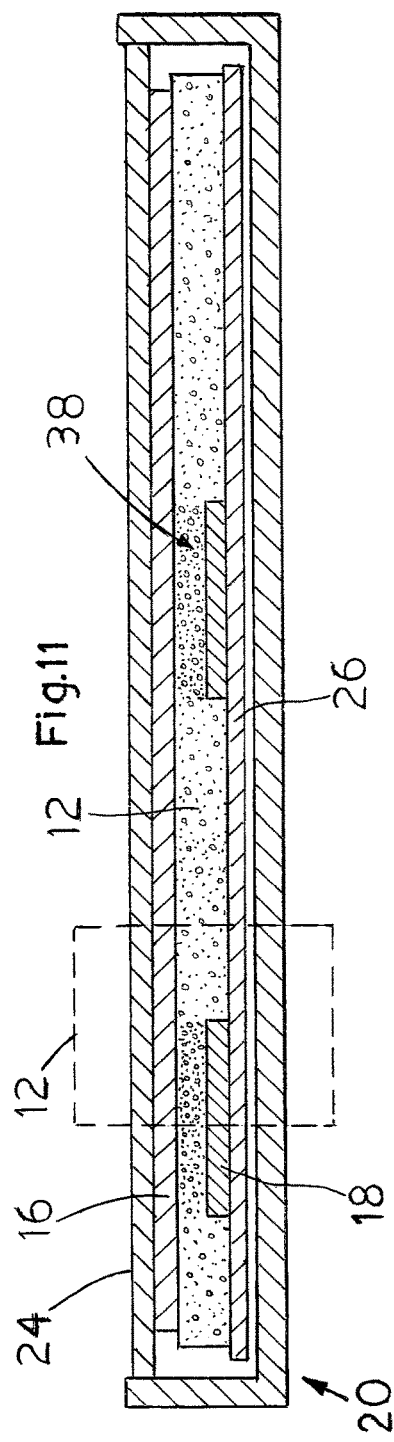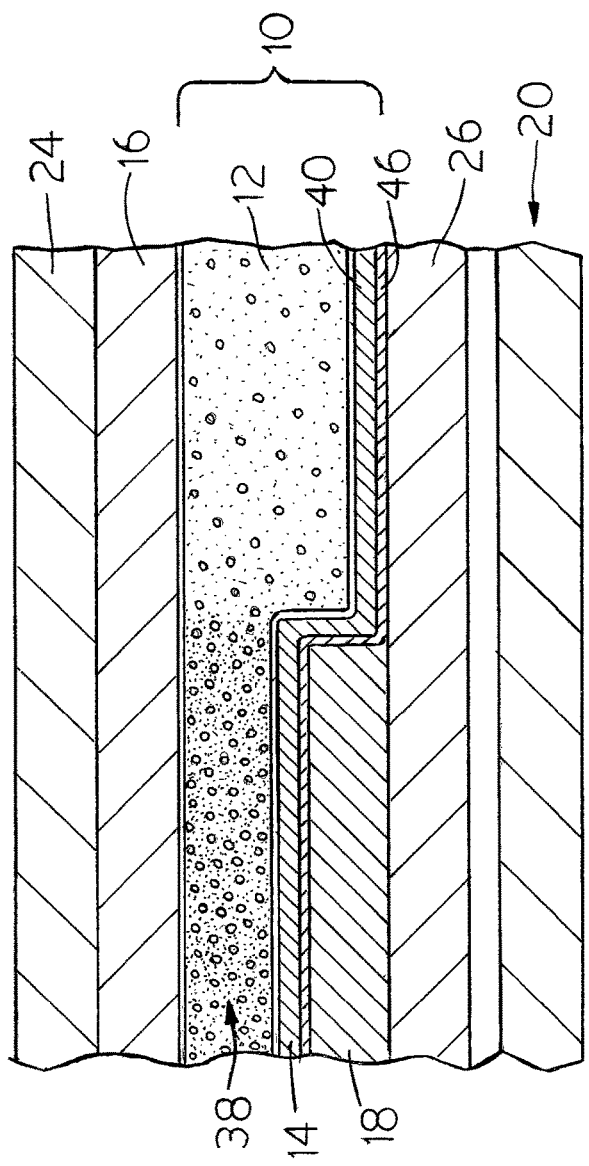

DENSIFIED FOAM FOR THERMAL INSULATION IN ELECTRONIC DEVICES

CROSS REFERENCE TO RELATED APPLICATIONS

This application claims the benefit of U.S. Utility application Ser. No. 15/357,800, filed Nov. 11, 2016, which claims the benefit of U.S. Provisional Application No. 62/257,307, filed Nov. 19, 2015, the disclosures of which are hereby incorporated by reference.

BACKGROUND OF THE INVENTION

As products across multiple market segments incorporate electronics with increasing processing power, the processors & components within those electronics are generating higher levels of point-source heat, potentially damaging nearby sensitive components within the products. Further, hot spots and generally the heat are objectionable to users as they handle the devices. Current technology employs heat "spreaders" as a means to prevent heat from generating hot spots within devices. These are typically a very thin layer of heat-resistant material (which is also heat conductive) placed inside the device, covering as much of the device footprint as possible. The spreader overlays and absorbs point source heat and conducts (spreads) it across its surface area, reducing "hot spots." A heat spreader that is more effective in both absorbing and moving heat as well as isolating sensitive components is needed.

SUMMARY OF THE INVENTION

The present invention involves the use of combining a densified polyimide-based foam layer with an integral traditional thin film heat spreader to improve the in-plane (XY direction) thermal conductivity of the heat spreader itself. This is achieved by utilizing the excellent thermal resistance of the polyimide foam material to block the through-plane heat flow, allowing the heat to channel through a path of least resistance, namely the in-plane direction. The improved thermal resistance created by the foam layer in combination with the heat spreader layer further improves the in-plane performance of a traditional isotropic heat spreader alone. The polyimide material has excellent thermal insulation properties and can withstand continuous use at elevated temperatures over the life of the product without thermal degradation, making it well suited for most thermal management applications requiring heat shielding and spreading performance. Combining the polyimide layer with the heat spreader also provides electrical insulation to allow the treatment to be sandwiched between common electronic components (like Printed Circuit Board Assemblies and/or displays). This solution combines both thermal protection as well as mechanical shock fortification due to its physical properties as cellular foam.

By adding a thin layer of polyimide foam thermal insulating material to a traditional heat spreader, a significant improvement is realized in heat shielding and spreading performance over the traditional product. The insulating material being proposed is densified polyimide foam. Polyimides are well-known as one of the highest thermal stability polymer classes and the foam configuration affords excellent thermal resistivity. Moreover, the polyimide foam offers approximately 4× the thermal resistance than polyimide film alone.

The present invention is well suited for any electronic device that possesses both heat generating electrical components in very close proximity with heat sensitive components (like display screens or batteries), particularly in small form factor or sealed devices in which traditional convection type cooling is not possible or practical, and heat spreader devices are commonly used to conduct heat away from and shield critical components from concentrated heat sources. This includes common consumer electronic devices like mobile phones, tablets and computers, televisions, home appliances, set-top boxes (residential communication), aviation or automotive instrumentation, or audio/infotainment devices. Due to the different size and shape of components on the circuit board, select areas can be further densified to accommodate the various elevations and thicknesses.

BRIEF DESCRIPTION OF THE DRAWINGS

A preferred embodiment of this invention has been chosen wherein:

FIG. 11 is a side view of section 11-11 of the device in FIG. 10; and

FIG. 12 is a partial view 12 of the section shown in FIG. 11.

DESCRIPTION OF THE PREFERRED EMBODIMENT

Figure 1:
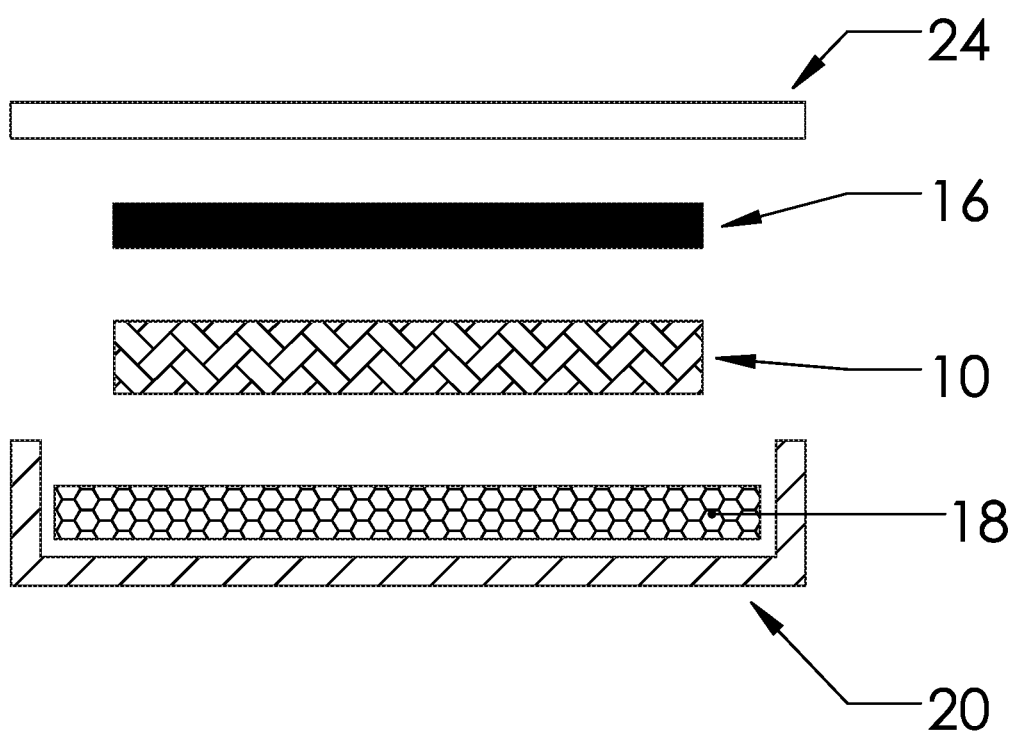
FIG. 1 is a side view of the treatment as installed in a mobile device.
Figure 2:
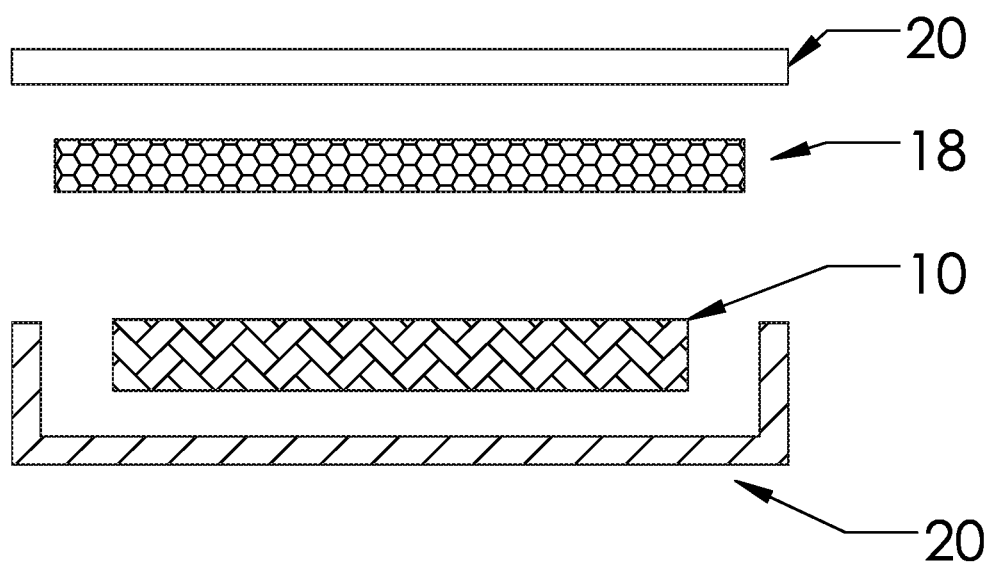
FIG. 2 is a side view of the treatment in FIG. 1 as used in a different mobile device.

The treatment 10, shown in all FIGS, both insulates and spreads heat. It is created by combining a thin layer of thermal insulating material 12 to a traditional heat spreader treatment 14. The heat spreader 14 is commonly graphite based or other thermally conductive material like metal foil. The heat shielding and spreading performance will be improved, better protecting sensitive components 16 of typical consumer electronic products (such as OLED displays). The insulating material 12 is a unique and novel version of densified polyimide foam. The treatment 10 consists of the lamination of a thin, foamed polyimide-based layer of insulating material 12 to typical heat spreader treatments 14, either to highly conductive graphite based spreader materials, or more common metal foil spreaders like copper or aluminum.

Figure 10:
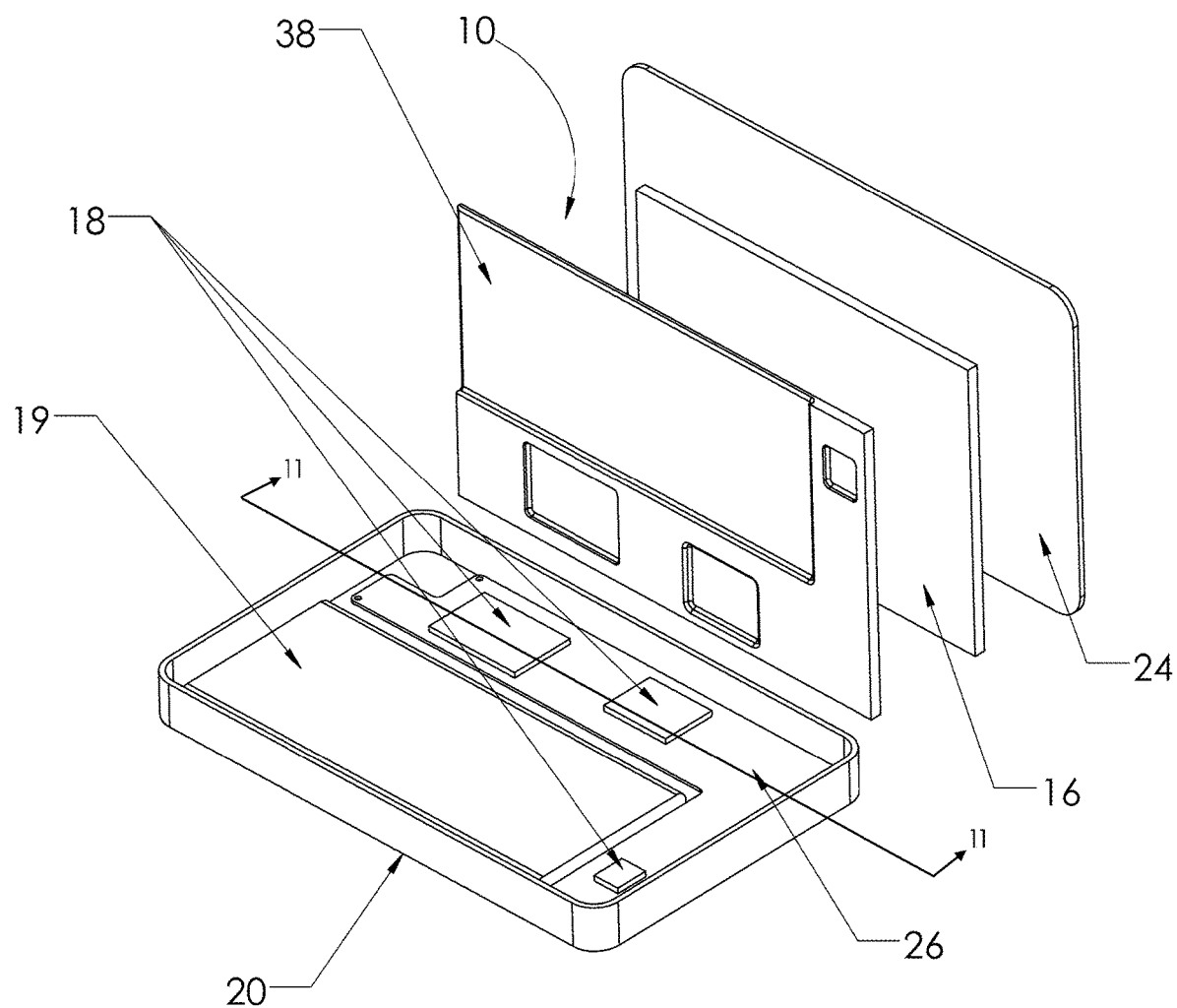
FIG. 10 is an exploded isometric view of a mobile device using the treatment with further densified areas.

The treatment 10 is intended for applications where small gaps (i.e. 0.25 to 5 mm) exist between a heat source such as a heat source 18 or battery 19 and heat sensitive components such as screen 16 that is typical of small form factor devices. As shown in FIG. 10, the heat sources 18 frequently are mounted to a circuit board 26 to make electrical connections. Heat sources 18 and batteries 19 rely on radiated heat to maintain internal temperatures. This is the case in sealed electronic devices 20 where it is impractical or impossible to use forced air cooling techniques. Therefore, graphite or foil based XY plane heat spreaders 14 are commonly used to conduct heat away from heat sensitive components 16 (when heat spreader 14 is attached to heat source 18), or act as heat shield for heat sensitive components 16 or the user, which typically touches the outside surface 22 of a top glass 24. The insulating layer 12 has the added benefit of providing electrical insulation of the heat spreader 14 to the heat sensitive components 16 (either an unsealed graphite, or metal foil type) preventing short circuit between adjacent electrical components.

The insulating layer 12 offers the benefit of improved thermal stability and resistance at elevated service temperatures without degradation over time, and low thermal conductivity compared to other plastic based films or foam layers. A foamed version of the polyimide material offers improved thermal resistance due to its unique foaming process that produces pockets that further reduce thermal conductivity by as much as 4× when compared to traditional polyimide (cast, blown or extruded) film material (typically from 0.12 W/mK to 0.043-0.049 W/mK). These cells can be either open or closed, depending on the process used to create them. The insulating layer 12 can be very thin (<0.05 mm) or very thick (>10 mm) depending on the requirements of the application.

Solimide polyimide based cellular foam is well established as an excellent thermal insulating material 12 with thermal conductivity values in the order of 0.039-0.046 W/mK. The material can further be "densified" through the process of applying heat and pressure collapsing the foam into a much thinner layer of increased density and improving the insulating properties by as much as ⅓. Densification can be applied to the foam to compress from a typical foamed density of ~0.4 lbs./cu.ft. to a range from 1 to 10 lbs./cu.ft. while maintaining or reducing the thermal conductivity (i.e. as much as 30% when compressed to 2 to 3 lbs./cu.ft. range). Densification produces a thinner insulating layer (0.25 to 2 mm) that would otherwise be difficult to skive using traditional slitting equipment (>2 mm). The thinner, denser foam retains much of its same cellular properties while being better suited to fit within the smaller form factor of typical consumer electronic devices. Depending on the final thickness of the insulating material desired, the material may be skived before or after densification. The thinnest final thickness commonly requires skiving before densification.

Exploded side views of several variants of treatment 10 are shown in FIGS. 3-9. The densified foam is an insulating layer 12 which has an adhesive facing surface 30 and an oppositely located outside facing surface 32. The distance between these surfaces 30,32 determines the thickness of the insulating layer 12. The treatment 10 can have a range of embodiments, some of which are shown in FIGS. 3-8. All of the embodiments of the treatment 10 have the insulating layer 12 bonded to a heat spreader 14 using a pressure sensitive adhesive layer 40. The pressure sensitive adhesive layer 40 is typically as thin as possible. For example, a thickness of 0.01 mm to 0.1 mm is common, but other thicknesses are contemplated.

The heat spreader 14 can be either a foil or graphite based material. Metal foil (typically aluminum or copper) has isotropic heat transfer properties, meaning that the heat transferred travels in all directions equally as it is applied at a specific point. Graphite is typically flexible but can be rigid, depending on the manufacturing processing used. Natural graphite, which is made of graphite flake, which has been "exfoliated" through a chemical and thermal reaction, then consolidated and compressed to rolls of spreader media. Synthetic or "Pyrolytic" graphite is commonly made from taking rolls of polyimide film which has been carbonized in an oven at temperatures approaching 2000 degrees C. then calendared down to thickness. Graphite, as a heat spreader 14, is commonly formulated to have anisotropic heat transfer properties. The typical heat transfer property in graphite heat spreaders 14 is highly conductive in-plane and is resistant to heat transfer through-plane. As described, it is a relatively thin sheet of material with two surfaces. Isotropic and anisotropic heat transfer properties are well known in the art. A component facing surface 34 and an adhesive facing surface 36 define the thickness of the heat spreader 14. A thin layer that effectively spreads heat is the most desirable property for the heat spreader 14. For a heat spreader 14 with anisotropic properties, there is a primary direction where heat travels along the plane of the material, but it is only a preferential heat transfer direction and some heat transfers through the thickness of the material.

Figure 3:
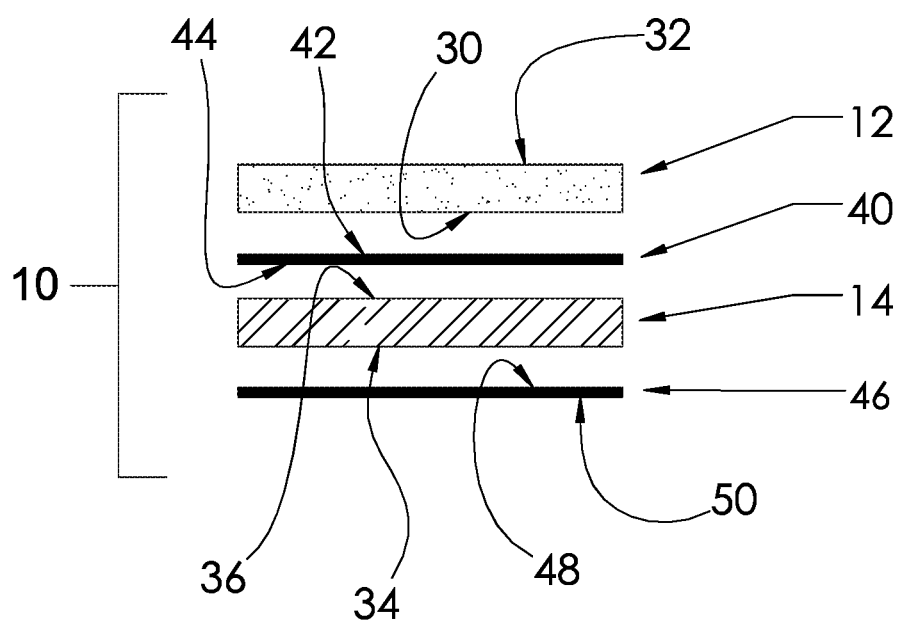
FIG. 3 is a side view of one embodiment of the treatment using a pressure sensitive layer to adhere to the heat generating components.

As shown in FIG. 3, the treatment 10 is made when the insulating layer 12 is permanently laminated to the heat spreader 14 using a thin pressure sensitive adhesive layer 40, creating a large sheet or continuous roll material that can be converted into a final part shape as a full construction. By combining the heat spreader 14 and the insulating layer 12, heat is drawn away from a heat source 18 on one side while heat sensitive components 16 located on the other side are shielded from adjacent heated areas. To make the treatment 10 more robust, easier to handle, cut, and install, it is necessary to permanently bond the heat spreader 14 to the insulating layer 12. This is accomplished through the pressure sensitive adhesive layer 40 as shown in FIGS. 3-9. The pressure sensitive adhesive layer 40, as shown, resides between the heat spreader 14 and the insulating foam layer 12. The pressure sensitive adhesive layer 40 has a first adhesive surface 42 and an oppositely located second adhesive surface 44. The purpose of this pressure sensitive adhesive layer 40 is to permanently bond the heat spreader 14 to the insulating layer 12. It is contemplated that the pressure sensitive adhesive layer 40 has some form of reinforcement, such as fiberglass strand or other material that reduces the ability of the material to be torn or stretched. The pressure sensitive adhesive layer 40, the insulating layer 12, and the heat spreader 14 are made as thin as possible while still effectively insulating and spreading unwanted heat. This is especially important when the material is used with compact mobile electronics, where space is a premium.

Figure 4:
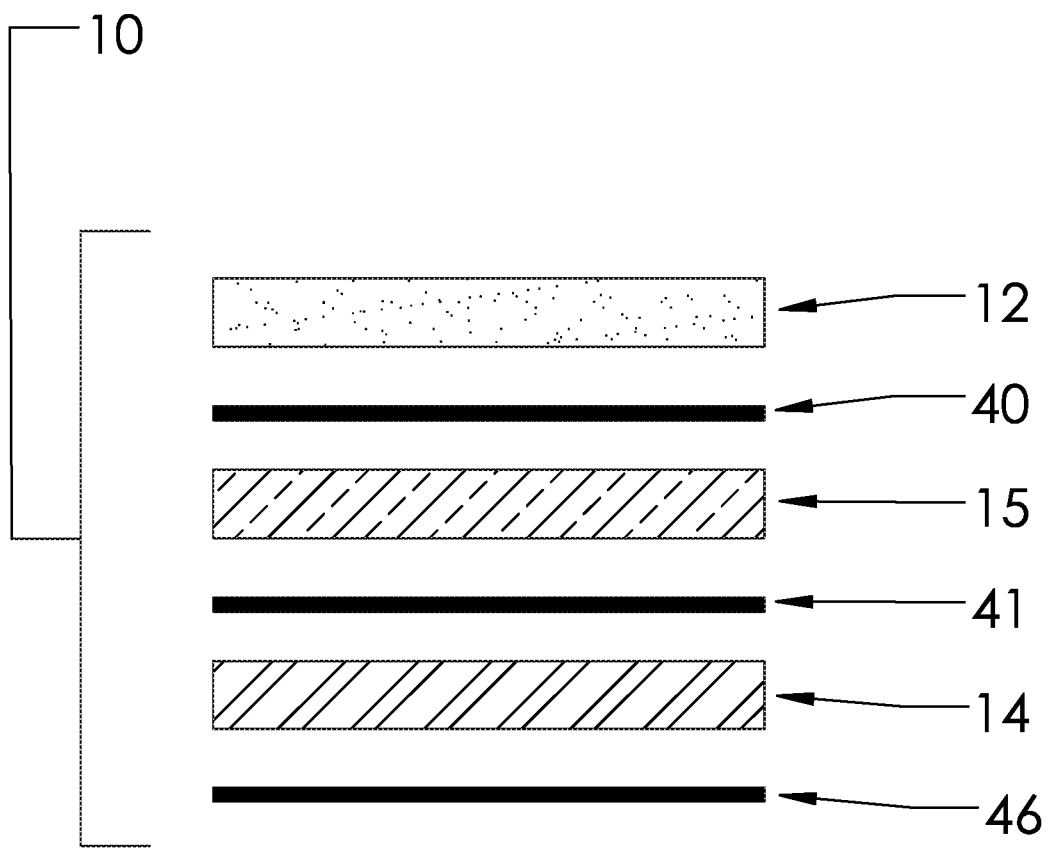
FIG. 4 is a side view of an embodiment of the treatment having a foil layer for EMI shielding.
Figure 8:
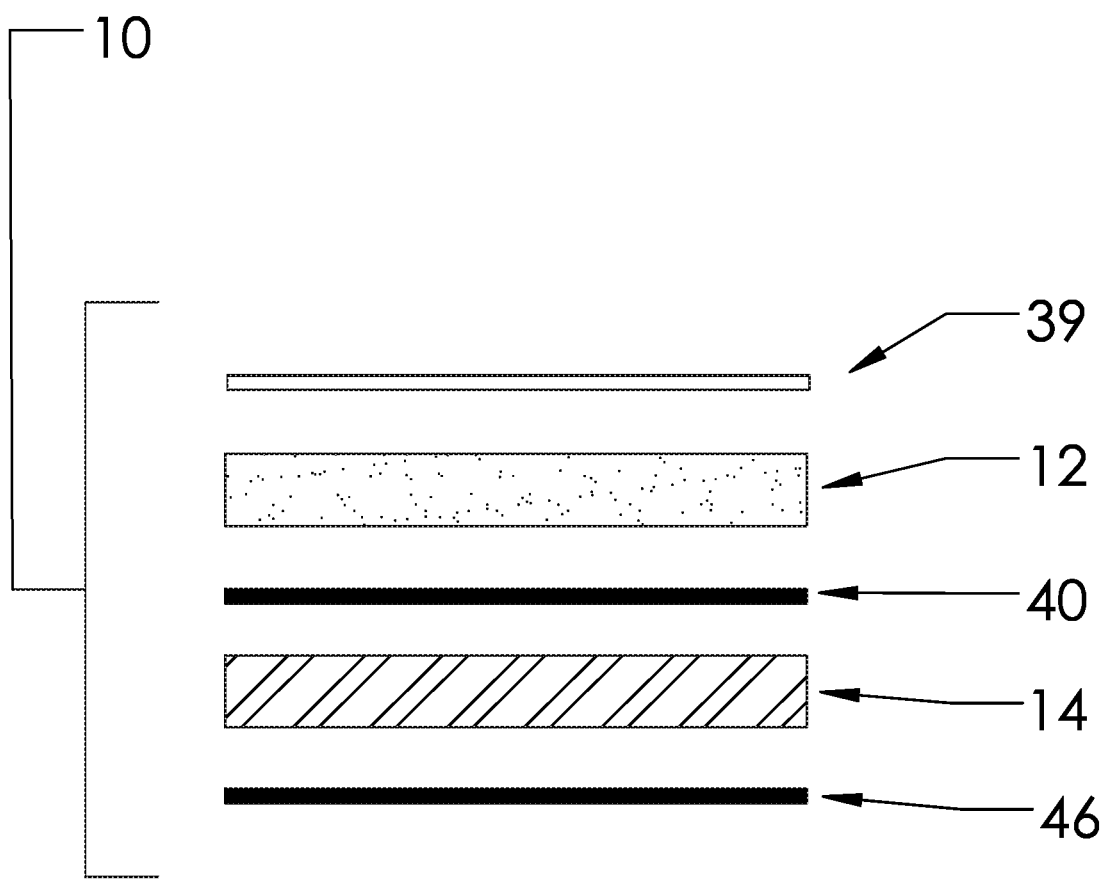
FIG. 8 is a side view of the treatment shown in FIG. 3 with a non-conductive layer to overlay the heat sensitive components.
Figure 9:
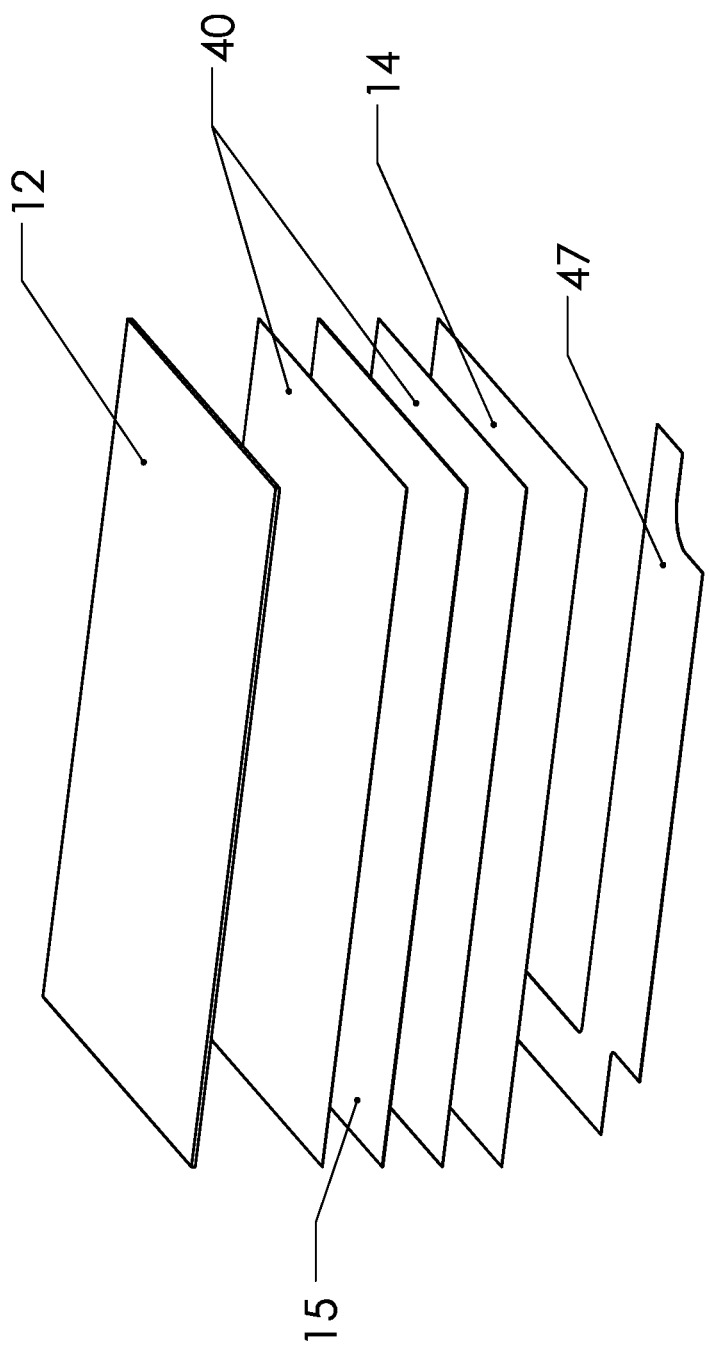
FIG. 9 is an exploded isometric view of the embodiment in FIG. 4 using selective pressure sensitive areas.

Several embodiments include a second pressure sensitive adhesive layer 46 that can be added when the treatment 10 is affixed to a device 20. The second pressure sensitive adhesive layer as described is shown in FIGS. 3, 4, and 8. The second pressure sensitive adhesive layer 46 has a first surface 48 and an oppositely located second surface 50. The first surface 48 has an adhesive coating that will adhere to the component facing surface 34 of the heat spreading material 14. The second pressure sensitive adhesive layer 46 also can serve as an electrical insulator if the material 10 overlays a circuit board with conductive portions that may be shorted if the heat spreader 14 directly contacted those portions. It is common that the second pressure sensitive adhesive layer 46 can be made from a thin material with dielectric properties (such as polyester, polyimide film, PET, or other material) to improve the electrical insulating properties when affixed to device 20. It is further contemplated that the second surface 50 has an adhesive coating (either fully covering surface 50 or selectively placed against surface 50) to allow it to be permanently adhered to a circuit board or other selective heat generating components.

Figure 5:
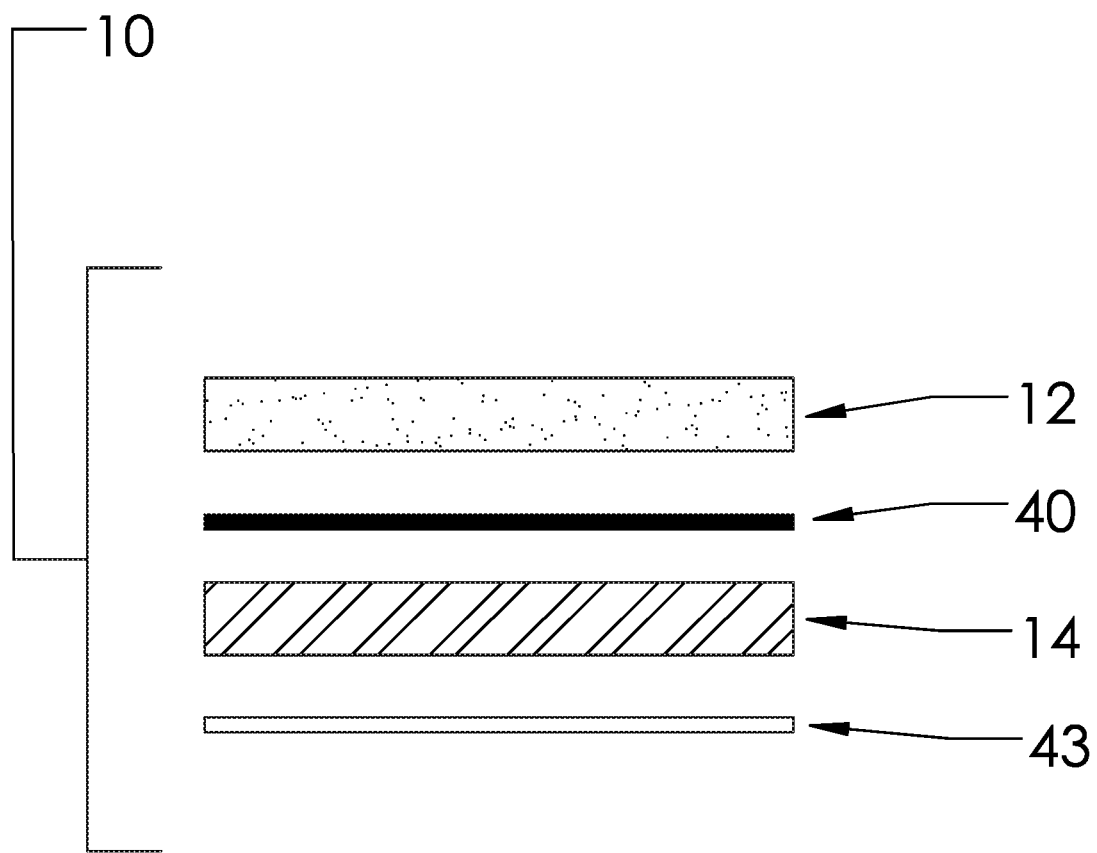
FIG. 5 is a side view of another embodiment of the treatment using a non-conductive layer to overlay the heat generating components.
Figure 6:
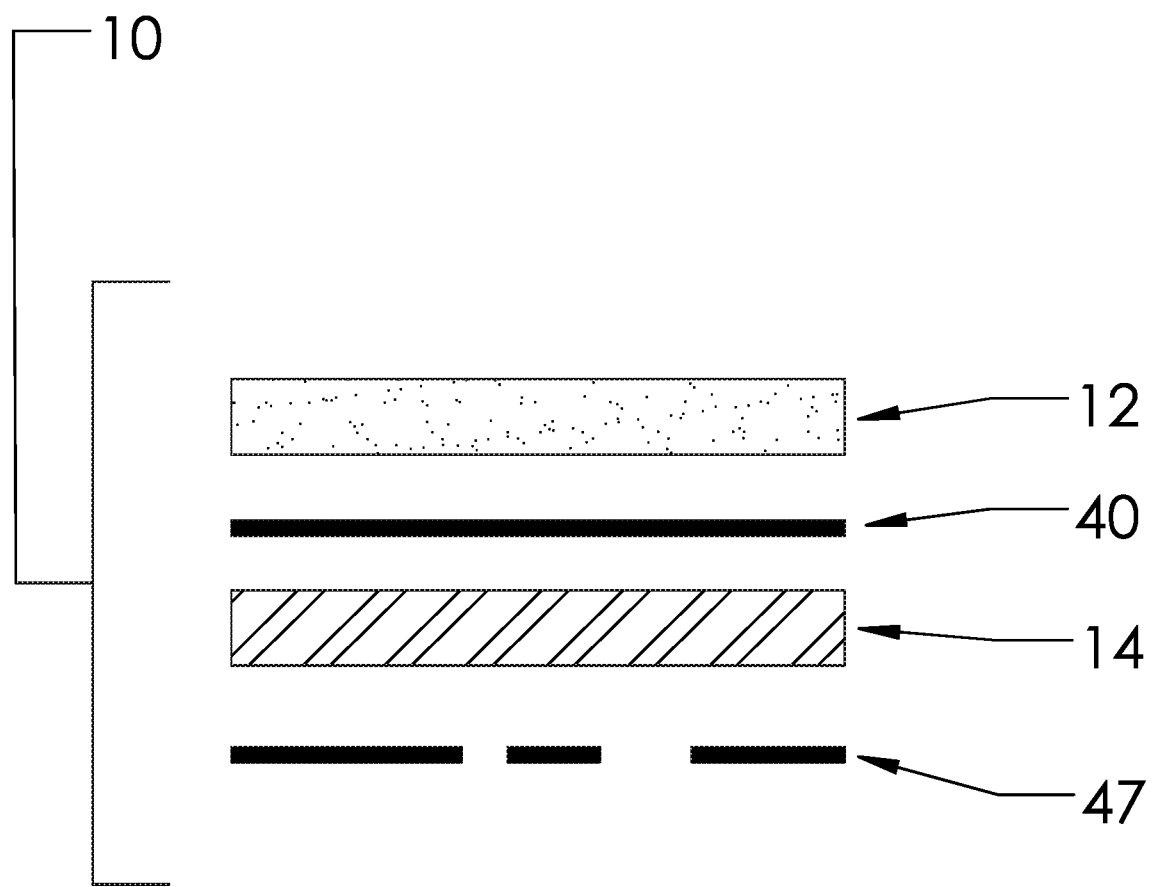
FIG. 6 is a side view of the embodiment shown in FIG. 3 using selective pressure sensitive areas.
Figure 7:
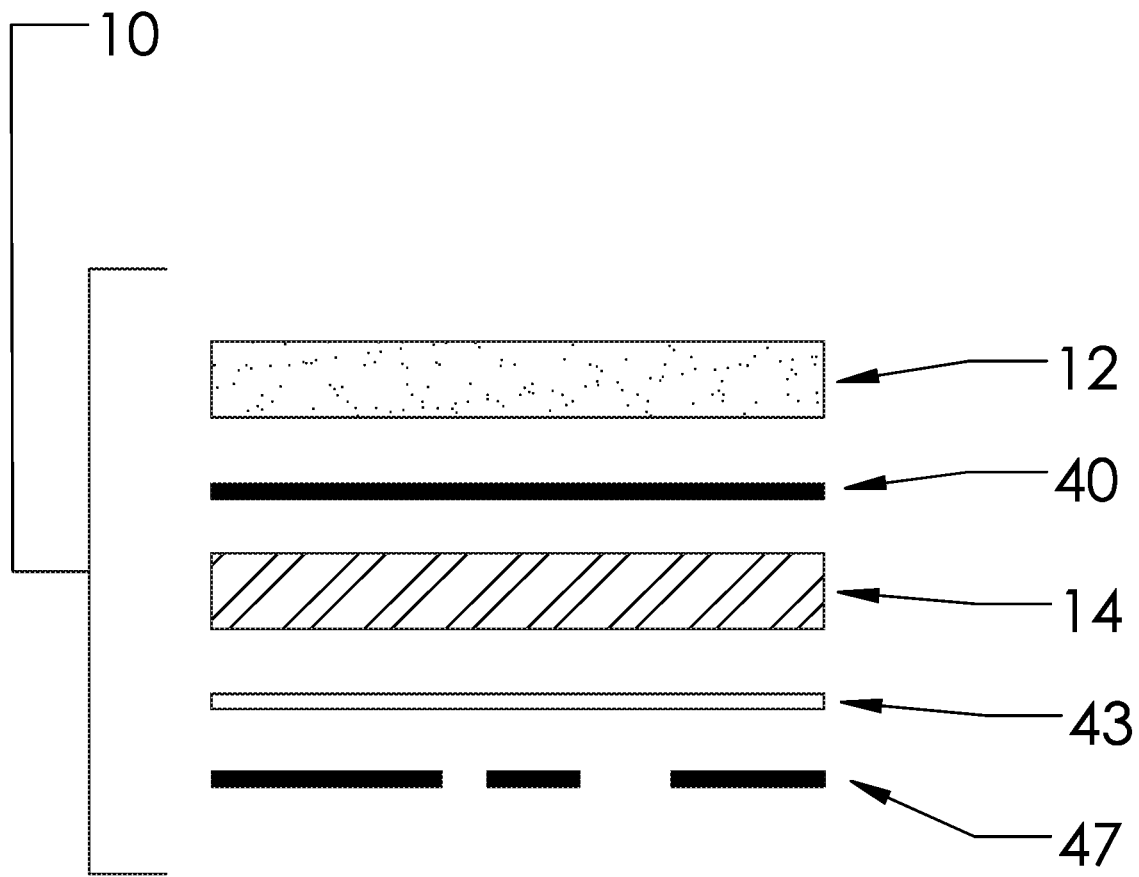
FIG. 7 is a side view of the treatment using selective pressure sensitive areas and a non-conductive layer to overlay the heat generating components.

The embodiment of the treatment 10 may include an electrical shield 15, typically for blocking electromagnetic radiation or interference (EMI). This embodiment is shown in FIG. 4. The electrical shield 15 may be copper foil, aluminum foil, mesh, screen, fabric, or other material that blocks radiation and interference. The shield 15 could also be a ferrite or magnetic based layer. The electrical shield 15 may necessitate an additional pressure sensitive adhesive layer 40, shown in FIG. 4. Another embodiment is shown in FIG. 5 that uses a dielectric layer 43 that is adhered to the heat spreader 14. The dielectric layer 43 is typically a thin material with dielectric properties (such as polyester, polyimide film, PET, or other material). The commonly used dielectric films used are blown or extruded plastic films such PET, PI, PP, LDPE, HDPE, and TPU. The dielectric layer 43 does not have an exposed adhesive surface that would allow the treatment 10 to adhere to the heat source 18. This is useful when the treatment 10 is adjacent to a component that would be removable, such as a battery 19. Another embodiment of the treatment 10 is shown in FIG. 6 where the pressure sensitive layer 47 has gaps. This is useful when portions of the treatment 10 would need to adhere to certain components but not other components adjacent to them. FIG. 7 shows a combination of the dielectric layer 43 and pressure sensitive layer 47. FIG. 8 shows the treatment 10 that further includes a dielectric layer 39 that overlays the insulating layer 12. The dielectric layer 39 is typically a thin material with dielectric properties (such as polyester, polyimide film, PET, or other material). The dielectric layer 39 in this embodiment is roughly 10 microns thick, but other thicknesses are contemplated.

As shown in FIG. 10, due to packaging constraints the treatment 10 may have further densified areas 38 where the insulating layer 12 is further compressed to a smaller thickness. For the embodiment of the treatment 10 with further densified areas 38, the additional densification may occur before the layers are combined or after. The further densified areas 38 retain most of the heat conductive and insulating properties but allow for taller components. FIG. 11 shows the treatment 10 in FIG. 3 as part of a device 20 with the further densified areas 38.

The individual layers that make up the treatment 10 each have a defined thickness that is consistent. One exception is where the insulating layer 12 has further densified areas 38. The insulating layer 12 and heat spreader 14 make up a majority of the thickness of the treatment 10. The pressure sensitive adhesive layers 40, 46 and dielectric layer 39, 43 are typically very thin comparatively.

The following examples and test setups are merely illustrative and do not limit this disclosure in any way. A summary of testing and thermal performance of the treatment 10 is described hereinafter in which a representative thermal case study was created. The study used a test setup which involved a circuit board with embedded heat sources and a simulated display layer where temperature is measured using an array of thermocouples. Temperature of the heat sources and display layer were monitored for a transient thermal event in which 2.56 W of thermal power was applied to heat sources through (3)×1876 Ohm resistors at 40 VDC for 15 m14inute cycle. A temperature vs. time test was performed with various combinations of heat spreader 14 and insulating layer 12 combinations. Details of the tests performed and the results are below.

The test setup was devised to help demonstrate the benefits of the above concept in a generic, non-product specific manner, but intended to replicate the typical environment of a consumer electronic product 20 like a laptop, tablet or smart phone. A F4 prototype PC board 102 (80 mm×110 mm×1.5 mm thick.) was used as the base structure, and three (3) 1.8 kΩ resistors were bonded to the underside of the board at arbitrary locations to simulate concentrated heat sources. The air cavity under the board was filled with a 1" thick layer of insulating foam to prevent external environmental factors from influencing test results.

The resistors were powered in parallel by a regulated DC power source capable of 0-50 Vdc output. The current draw to all three resistors was monitored. Thermocouples were embedded at each resistor location to monitor point source temperatures. Individual potentiometers were used to fine adjust the voltage to each resistor to achieve a desired temperature. For the test results presented below, a target temperature of 75 C for each heat source was selected. An input voltage of 40 Vdc was set on the power supply then each potentiometer was adjusted to achieve the target temperature. After a minimum dwell time of 15 minutes, the temperatures of the resistors reached a steady-state condition of 75 C with the PC board.

To simulate the heat sensitive component 16 being protected by the treatment 10 (i.e. OLED display), a 0.010" thick aluminum plate (100 mm×120 mm) was mounted parallel to the board at fixed distance above the PCB (either 0.5 or 1.0 mm). A grid of twelve (12) flush mounted thermocouples were mounted to the top surface of the aluminum plate as shown in FIG. 8. The following temperature readings were recorded as a function of time: (3) reference T/C's at point sources R1, R2, R3; (12) output T/C measurement grid on aluminum display plate; (1) T/C at center point of display plate.

The basic test event was intended to record the transient temperature rise from powering the heat sources from an ambient condition (~22 C) for 1000 sec. duration. Minimum 15 minute dwell time between measurements was used to ensure the test device returned to ambient temperature. Once resistors were set to achieve desired temperature, no changes to the individual potentiometers or input voltage were made for the balance of the testing. Several repeat experiments were conducted to establish consistency of the test setup and results.

The test specimen consisted of a 65 mm×98 mm sample placed and centered on the top side of the PC board. The basic samples consisted of a 0.025 mm thick synthetic graphite heat spreader material 14 (i.e. 1500 W/mK) bonded to either a 0.5 mm or 1.0 mm thick insulating foam layer 12. The base foam used was Solimide HT-340 polyimide foam at 0.4 pcf (or pounds per cubic foot) starting density that was then compressed to either 0.5 mm or 1.0 mm thick from a specified starting thickness to achieve the desired final density. Various foam density values were investigated (from 2 to 10 pcf). The layup consisted of a thin PET backing film+thin bonding PSA layer 46+graphite heat layer 14+thin bonding PSA layer 40+insulating foam 12. The graphite layer was placed against the heat source (PCB) while the insulating foam layer was against the bottom side of the 10 mil aluminum display plate 106.

Two control experiments were also performed: 1) replacing the densified polyimide foam with a more thermally conductive (2×) polyurethane foam; 2) removing the insulating layer using only the graphite heat spreader 14 with a 1 mm air gap between the display plate and heat spreader 14. In all three cases (invention concept vs. control cases), only a slight reduction in the surface temperature of the display plate was observed (<1 C). The chief difference was the impact the treatment had on the reference temperatures of the heat sources 18. Using the case of the 1 mm air gap as the untreated, baseline, the graphite+air gap control sample increased the average resistor temperature by +2.4 C, while the graphite+PU foam case showed a −0.9 C drop. However, for the case of the graphite+Solimide foam, an 8.5 C temperature drop was observed. These tests were repeated and the findings were consistent.

Typical results demonstrate the change in average resistor temperature vs. time for the different configurations as an indication of the heat spreading performance. Though only a small reduction in temperature was observed, the more interesting result is the larger reduction of heat source temperature when using the polyimide insulating layer 12 vs. heat spreader 14 only w/ an air gap. The additional 8.5° C. drop in temperature comes with no change in the electrical input voltage or current to the heat sources, implying that the heat spreader 14 performs better when backed with the polyimide insulating layer 12.

It is understood that while certain aspects of the disclosed subject matter have been shown and described, the disclosed subject matter is not limited thereto and encompasses various other embodiments and aspects. No specific limitation with respect to the specific embodiments disclosed herein is intended or should be inferred. Modifications may be made to the disclosed subject matter as set forth in the following claims.

What is claimed is:

1. A heat spreading and insulating material for use with a mobile device having heat generating components and heat sensitive components, said material comprising:
    a unitary thermal insulating layer formed from a densified sheet of polyimide open cell foam, said densified sheet having a first density between 25-60 kg/m$^3$, said densified sheet having an outwardly facing surface and an oppositely located inwardly facing surface, said outwardly facing surface being spaced from said inwardly facing surface to define a first thickness;
    said unitary thermal insulating layer having further densified areas where said insulating layer is further densified to have a density greater than said first density, said outwardly facing surface is spaced from said inwardly facing surface to define a second thickness in said further densified areas, said second thickness in said further densified areas being smaller than said first thickness;
    a first adhesive layer having a first adhesive surface and an oppositely located second adhesive surface, said inwardly facing surface of said insulating layer adheredly contacting said first adhesive surface, said first adhesive layer conforming to said inwardly facing surface;
    a heat spreading layer formed from a material that conducts heat and having an adhesive facing surface and an oppositely located component facing surface, said adhesive facing surface separated from said component facing surface to define a thickness, said adhesive facing surface adheredly contacting said second adhesive surface of said first adhesive layer, said heat spreading layer conforming to said second adhesive surface; and
    an electrically insulating layer adhered to said component facing surface of said heat spreading layer.

2. The heat spreading material of claim 1, when said heat spreading layer is adjacent said heat generating components, heat from said heat generating components preferentially transfers along said thickness of said heat spreading layer.

3. The heat spreading material of claim 1, wherein said electrically insulating layer has an exposed adhesive surface to form a second pressure sensitive adhesive layer, said second pressure sensitive adhesive layer in contact with said heat generating components.

4. The heat spreading material of claim 3, wherein said second pressure sensitive adhesive layer has gaps in said exposed adhesive surface.

5. The heat spreading material of claim 1, when said heat spreading layer contacts said heat generating components, heat from said heat generating components preferentially transfers along said thickness of said heat spreading layer.

6. A heat spreading and insulating material for use with a mobile device having heat generating components and heat sensitive components, said material comprising:
    a unitary thermal insulating layer formed from a densified sheet of polyimide open cell foam, said densified sheet having a first density between 25-60 kg/m$^3$, said densified sheet having an outwardly facing surface and an oppositely located inwardly facing surface, said outwardly facing surface being spaced from said inwardly facing surface to define a first thickness;
    said unitary thermal insulating layer having further densified areas where said insulating layer is further densified to have a density greater than said first density, said outwardly facing surface is spaced from said inwardly facing surface to define a second thickness in said further densified areas, said second thickness in said further densified areas being smaller than said first thickness;
    a first adhesive layer having a first adhesive surface and an oppositely located second adhesive surface, said inwardly facing surface of said insulating layer adheredly contacting said first adhesive surface, said first adhesive layer conforming to said inwardly facing surface; and
    a heat spreading layer formed from a material that conducts heat and having an adhesive facing surface and an oppositely located component facing surface, said adhesive facing surface separated from said component facing surface to define a thickness, said adhesive facing surface adheredly contacting said second adhesive surface of said first adhesive layer, said heat spreading layer conforming to said second adhesive surface.

7. The heat spreading material of claim 6, further comprising an electrically insulating layer adhered to said component facing surface of said heat spreading layer.

8. The heat spreading material of claim 7, wherein said second pressure sensitive adhesive layer is in contact with said heat generating components.

9. The heat spreading material of claim 7, when said heat spreading layer is adjacent said heat generating components, heat from said heat generating components preferentially transfers along said thickness of said heat spreading layer.

10. The heat spreading material of claim 7, wherein said electrically insulating layer has an exposed adhesive surface to form a second pressure sensitive adhesive layer.

11. The heat spreading material of claim 10, wherein said electrically insulating layer has gaps in said exposed adhesive surface.

\* \* \* \* \*